United States Patent
Büstrich et al.

[11] Patent Number: 5,728,247
[45] Date of Patent: Mar. 17, 1998

[54] METHOD FOR MOUNTING A CIRCUIT

[75] Inventors: Günther Büstrich, Stockholm; Lars Erik Pontus Lundström, Saltsjö-Boo, both of Sweden

[73] Assignee: Telefonaktiebolaget LM Ericsson, Stockholm, Sweden

[21] Appl. No.: 620,950

[22] Filed: Mar. 25, 1996

Related U.S. Application Data

[63] Continuation of Ser. No. 132,872, Oct. 7, 1993, abandoned.

[30] Foreign Application Priority Data

Oct. 7, 1992 [SE] Sweden ................ 9202943

[51] Int. Cl.⁶ .................... B32B 31/04; H01L 23/48
[52] U.S. Cl. ............ 156/256; 156/196; 29/832; 29/842; 257/783; 257/784
[58] Field of Search .......................... 156/256, 267, 156/269, 196; 257/666, 676, 735, 736, 783, 784, 786; 29/827, 832, 842

[56] References Cited

U.S. PATENT DOCUMENTS

| | | | |
|---|---|---|---|
| 3,666,588 | 5/1972 | Wanesky | 257/736 X |
| 4,620,215 | 10/1986 | Lee | 257/735 X |
| 4,903,118 | 2/1990 | Iwade | 257/783 |
| 4,967,260 | 10/1990 | Butt. | |
| 4,967,261 | 10/1990 | Niki et al. | 257/735 |
| 4,985,749 | 1/1991 | Berneur et al. | 257/735 |
| 5,002,818 | 3/1991 | Licari et al. | |
| 5,036,380 | 7/1991 | Chase. | |
| 5,061,988 | 10/1991 | Rector. | |
| 5,140,404 | 8/1992 | Fogal et al. | 257/783 |
| 5,146,662 | 9/1992 | Fierkens | 29/827 X |
| 5,152,054 | 10/1992 | Kasahara | 29/827 |
| 5,153,708 | 10/1992 | Ohikata et al.. | |
| 5,210,936 | 5/1993 | Simmons et al. | 29/827 |

FOREIGN PATENT DOCUMENTS

| | | | |
|---|---|---|---|
| 5449066 | 4/1979 | Japan | 257/735 |
| 59224152 | 12/1984 | Japan | 257/735 |
| 3167836 | 7/1991 | Japan | 257/784 |

*Primary Examiner*—Curtis Mayes
*Attorney, Agent, or Firm*—Burns, Doane, Swecker & Mathis L.L.P.

[57] ABSTRACT

The present invention provides a method when using chips for tape automated bonding, or TAB structures, whereby a demand of having particular cutting and bending tools for each type of TAB structure as well as a particular thermod will no longer be necessary for the mounting of the TAB structures in a final circuit configuration. The terminal leads of a TAB structure are cut along the four sides by means of a particular cutting tool. Furthermore either the chip is glued to the substrate and/or the remaining portions of the cut terminal leads of the TAB structure are glued to the substrate, whereby if desirable intermediate shielding or dielectric layers simply may be arranged, whereupon all terminals are wire-bonded to the substrate according to prior art. TAB structures hereby may conveniently be used also for low levels of production without a raised investment cost for particular different tools for the respective chips.

8 Claims, 3 Drawing Sheets

METHOD FOR MOUNTING A CIRCUIT

This application is a continuation of application Ser. No. 08/132,872, filed Oct. 7, 1993, now abandoned.

TECHNICAL FIELD

The present invention relates to a method when using TAB (Tape Automated Bonding) structure circuits and more exactly to a method whereby the terminal leads of the TAB structure are cut close to the circuit chip and according to which method the circuit is glued to the substrate prior to that the terminals of the TAB structure chip are bonded to the substrate for a final interconnection in the circuit configuration.

PRIOR ART

The TAB technique is a rational method to handle integrated circuit chips, these normally being delivered on a type of film strip for automated assembling by means of specific machines. The semiconductor chip then is first interconnected to a terminal lead pattern which is etched on the film strip and the semiconductor chip and its terminal lead pattern is then punched out of the film strip. The terminal lead pattern of the film strip connected to the semiconductor chip may then be interconnected to the final circuit configuration Generally by compression bonding by means of a thermod.

This film supporting the chips accomplish a favorable handling and testing of the circuits. However, to the one mounting the circuits, there are drawbacks regarding the handling of the film, especially in smaller series and in the production of prototype designs. Among other things there is a demand of a particular cutting and bending tool for each type of TAB structure. Besides in a so called 'gang bond', where all leads are bonded or connected simultaneously a specific thermod is needed for each size of chip and embodiment of the terminal lead pattern etched onto the film.

U.S. Pat. No. 5,061,988 discloses an integrated chip interconnect combining TAB techniques and conventional wire-bonding to accommodate a variety of different chips by the same configuration, the interconnect allowing individual testing of each chip prior to the interconnect's mounting in a multi chip module. The document demonstrates wire-bonding to the TAB structure as an alternative to chip mass bonding to the TAB structure.

DESCRIPTION OF THE INVENTION

An object of the present invention is to provide a method using chips having a TAB structure which method is utilizing the possibilities of the TAB technique of rational testing prior to the final application of the chip in a final circuit configuration onto a substrate, but through which method the demand of particular cutting and bending tools as well as a particular thermod is avoided in the interconnecting of the particular TAB structure into the final circuit configuration.

According to the method of the present invention, the terminal leads of the TAB structure are cut by a general cutting tool along its four sides after testing of the chip, which tool then is used for different existing embodiment sizes of the TAB structure.

Additionally according to the method of the present invention, the chip of the TAB structure is then glued onto the substrate in the final circuit configuration, either by gluing of the chip itself to that and/or by gluing of the remaining portion of the TAB structure cut terminal leads to the substrate, if desirable intermediate screening or dielectric layers are simply arranged, and whereupon all terminals are according to prevalent techniques wire-bonded onto the substrate having the final circuit configuration.

Further according to the method of the present invention no bending of the TAB structure terminal leads is needed in the normal case, as bending normally is performed so that these terminal leads are resilient so as to be able to absorb mechanical tension motions, whereby according to the method these mechanical tension motions also in a natural way are taken up in part by the wire-bonding for the interconnection of the chip to the circuit configuration substrate preformed according to the method of the present invention and in part by the use of a slightly resilient glue.

According to the method of the present invention in a so called "face-down" mounting the leads of the TAB structure are cut such that very short leads remain to which the wire-bonding is then performed to adjacent bonding pads on the substrate and which bonding wires are arranged as short as possible, whereby since the bondings are made close to the chip a saving of the substrate surface is obtained.

According to the method of the present invention in a so called "face-up" mounting, i.e. having its active surface directed upwards, the leads are cut as close as possible to the edge of the chip and wire-bonding is made at the terminals at the upper side of the TAB structure over the terminals on the silicon chip.

Due to the method of the present invention a possibility is obtained to use chips having a TAB structure also in small production volumes where an investment in different special tools is a prominent factor in the production cost.

DESCRIPTION OF THE DRAWINGS

The method of the invention will be described by means of the attached figures in which equal reference numerals are used for corresponding members in the different drawings which show.

AN ILLUSTRATIVE DESCRIPTION OF THE METHOD

For a start it is shown, in

Figure 1A:
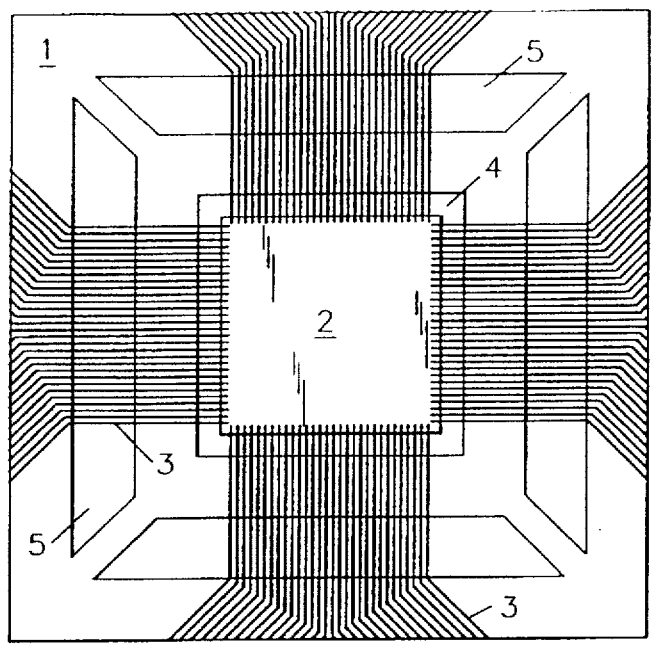
FIG. 1a demonstrates a plane view of a typical embodiment of a chip with a TAB structure having an etched terminal lead pattern with a variety of terminal leads arranged along the four sides of the chip.

FIG. 1a, an example of a typical TAB structure in a top plane view labeled generally with 1, the semiconductor chip 2 being centrally positioned at and interconnected to an electrically conducting terminal lead pattern 3 produced, e.g., photographically and/or etched, over a thin, sufficiently resistant surface of, for instance, polyimide or a similar plastic film, which then serves as a carrier of the semiconductor chip 2. This type of TAB structure 1 additionally demonstrates standardized openings in the carrier film with in part an opening 4 for the chip 2 and in part openings 5 being positioned underneath the terminal lead pattern 3 and defining a ring of carrier material of, e.g., polyimide.

Figure 1B:
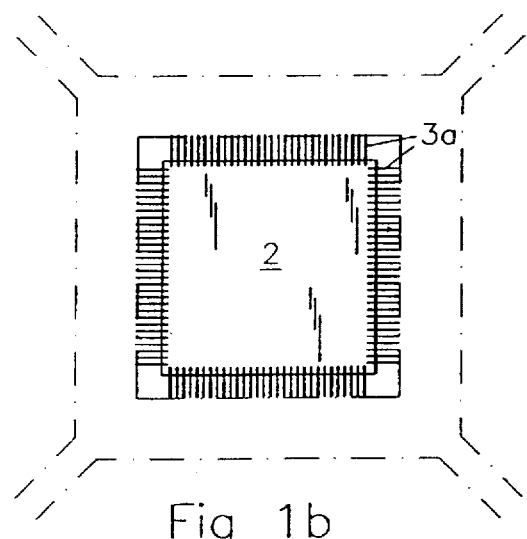
FIG. 1b demonstrates a plane view of the TAB structure of FIG. 1a after cutting for a mounting with the active side facing downwards in a so called 'face-down' mounting.

FIG. 1b illustrates the way the terminal pattern 3 of the circuit, shown i FIG. 1, is cut at a short distance from the chip 2, preferably at the inner delimiting line of the ring formed by the openings 4 and 5 in the supporting film, for the mounting of the TAB structure 1 onto a substrate according to the method of the present invention in a mount having the active side downwards, i.e., a so called 'face-down' mounting. When cutting along this inner delimiting line of the ring, between the openings 4 and 5, a tiny portion of the terminal lead pattern 3a will be uncovered for interconnection, whereby it is also possible to bend the terminal leads slightly if such a mount should be wanted. Such a circuit assembly is exemplified in FIG. 2, which is a central cross-section of the cut circuit, shown in FIG. 1b, where 11 indicates a lump of glue is holding the terminal leads 3a onto the substrate, which in turn presents bonding pads 12 to which the terminal leads 3a are bonded with bonding wires 15. A glue material is preferably used which is slightly resilient or compliant material, whereby the circuit will not rest totally butt on the terminal leads 3a.

Figure 1C:
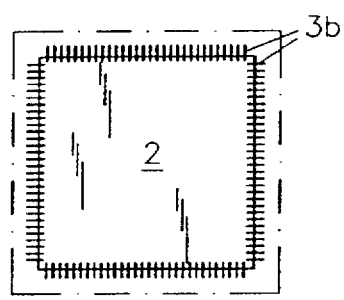
FIG. 1c demonstrates a plane view of the TAB structure of FIG. 1a after cutting for a mounting with the active side facing upwards in a so called 'face-up' mounting.
Figure 1D:
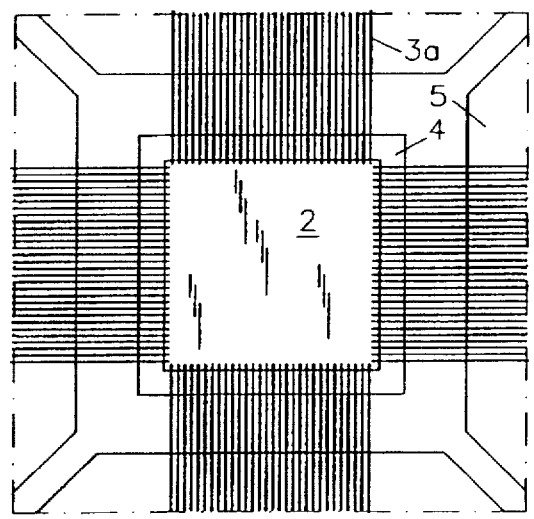
FIG. 1d demonstrates a plane view of the TAB structure of FIG. 1a after cutting but retaining the ring, as an example of polyamide.
Figure 2:
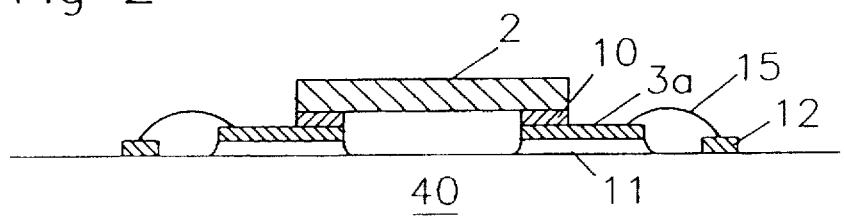
FIG. 2 demonstrates a side cross-section view of the chip and the TAB structure chip of FIG. 1b, in a mount having the active side downwards and having short bonding wires.
Figure 3A:
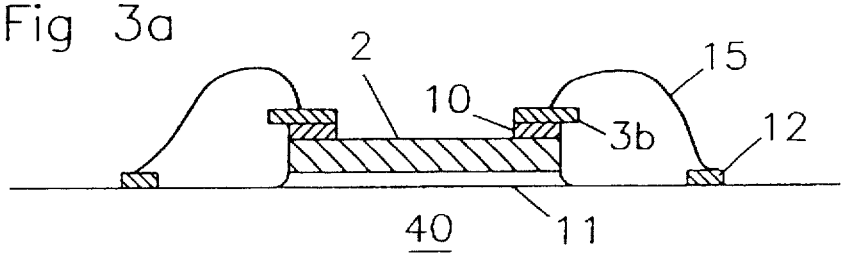
FIG. 3a demonstrates a side cross-section view of the chip and the TAB structure of FIG. 1c, in a mount having the active side upwards.

In a similar manner, FIG. 1c illustrates the way the terminal lead pattern 3 and the film demonstrated in FIG. 1a, respectively, are cut as close as possible to the semiconductor chip 2, preferably at the delimiting line of the opening 4 in the supporting film, for a mounting of the TAB structure 1 onto a substrate according to the method of the present invention in a mount having the active side upwards, i.e., a so called 'face-up' mounting. Such a circuit assembly is exemplified in FIG. 3a, which is a central cross-section of the cut circuit, shown in FIG. 1c, where 11 indicates a lump of glue holding the semiconductor chip 2 onto the substrate 40, which in turn presents bonding pads 12 to which the terminal leads 3b via the chip bumps 10 are bonded with bonding wires 15 to the bonding pads 12 on the substrate 40. A glue material is preferably used which is slightly resilient or a compliant material, whereby the semiconductor chip will not rest totally butt on the substrate.

Figure 3B:
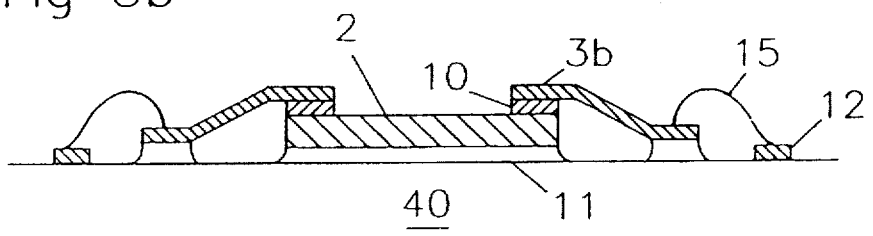
FIG. 3b demonstrates a side view having a cut through the chip of the TAB structure in a mount having the active side upwards and where the terminal leads are cut long and being bent towards the substrate and interconnected analog to the way demonstrated in FIG. 2.

FIG. 3b illustrates a corresponding assembly having a so called 'face-up' mounting in which the terminal leads 3b are cut longer instead, whereby these by a suitable bending tool are bent down towards the substrate are bonded and with short bonding wires 15 to bonding pads 12 on the substrate. The TAB circuit may, for instance, in this type of assembly be cut according to FIG. 1d whereby a ring of the supporting film is maintained around the chip and the terminal leads are cut on level with the outer delimiting line of the openings 5 in the supporting film. If desired the remaining corner pieces can be cut away, such that a complete square ring is formed around the chip as an extra support for the terminal leads.

Figure 4A:
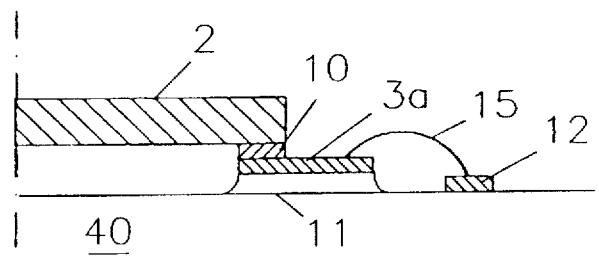
FIG. 4a demonstrates in an enlargement a basic embodiment of mounting the active side downwards according to FIG. 2.

FIG. 4a shows an enlargement of a basic embodiment of the assembly having the active side downwards, the circuit by a certain resilient action of the glue is in principal not totally resting on the terminal back and any small motions will relatively, be absorbed by the electrical interconnection to the substrate by the bonding wires 15. In an preferred embodiment the ends of the terminal leads 3a are arranged adjacent to the bonding pads 12, whereby a very short bonding wire is used for the interconnection.

Figure 4B:
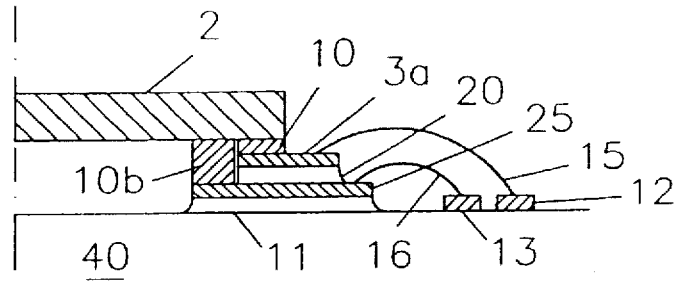
FIG. 4b demonstrates in an enlargement the assembly having the active side downwards when using several interconnection layers.

FIG. 4b illustrates an additional embodiment of the assembly demonstrated in FIG. 4a. Here the terminal leads 3a are provided with an additional conducting screen 25 between the terminal leads 3a and the substrate. The screen 25 is insulated from the terminal lead 3a by an insulating layer 20, for instance, an additional thin plastic film similar to the supporting film 4 (FIG. 1a). The terminal leads 3a are bonded as before by bonding wires 15 to respective bonding pads 12 on the substrate, while the screen 25 is connected by separate bonding wires 16 to bonding pads 13 on the substrate 40 having a suitable potential. It is also possible to connect the screen 25 via a separate chip bump 10b to the semiconductor chip 2. With this method it is also possible to arrange a multilayer TAB interconnection by a doubling of the lead pattern 3 on a multilayer supporting film 4, the connection by bonding wires to the substrate simply facilitating this due to that the bonding wires according to FIG. 4b simply give the possibility of connection to, behind each other positioned, bonding pads 12 and 13 on the substrate 40.

Figure 5A:
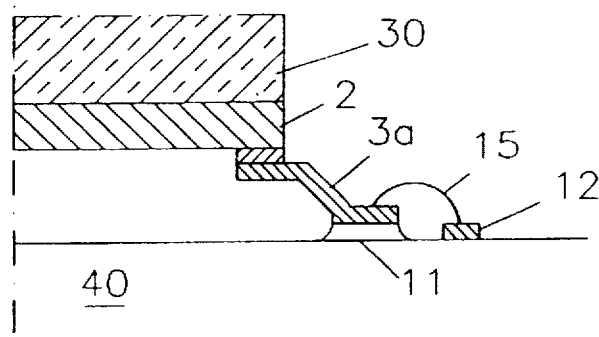
FIG. 5a demonstrates an embodiment corresponding to the one demonstrated in FIG. 4a but having a bending of the terminals to obtain an additional resilience, e.g. when using a cooling body at the back of the chip.
Figure 5B:
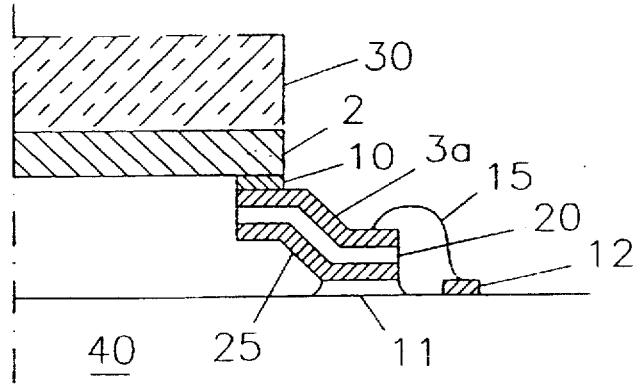
FIG. 5b demonstrates an embodiment corresponding to the one demonstrated in FIG. 4b having for instance an extra screen at the terminals and additionally having a bending of the terminals to obtain an additional resilience, e.g. when using a cooling body at the back of the chip.

A further possible embodiment of the assembly having the active side downwards is shown in FIG. 5a. Furthermore, the terminal leads 3a are here bent slightly to obtain additional resilience upon, for example, connection of the semiconductor chip back to a suitable cooling body 30. In such an assembly, a cutting of the circuit according to FIG. 1d may advantageously be used with an extra support for the terminal leads by the circumferential ring of carrier material illustrated in FIG. 1d. In a similar manner, FIG. 5b analogous illustrates a corresponding arrangement using a screen 25 which is analog to FIG. 4b between the terminal leads 3a and the lumps of glue 11 on the substrate 40. Consequently, the screen 25 is interconnected in a corresponding manner as is demonstrated in FIG. 4b.

Thus, the application of a TAB structure according to the method of the present invention takes place according to a method described below. First, the TAB structure is cut according to FIGS. 1b, 1c or 1d dependent of the way the circuit should be mounted. For the cutting a cutting device having two perpendicularly arranged cutting edges, which then produces a cut having a 90° corner, is preferably used. By this method, two adjacent sides are cut simultaneously and the TAB structure has to be positioned in only two different cutting positions to attain a circuit cut according to FIGS. 1b, 1c or 1d. The length of the two, to each other perpendicular, cutting edges are then independent of the dimensions of the TAB circuit, as a result only one tool is needed for all present TAB structures.

Subsequently, the chip is positioned with the cut TAB structure onto the substrate together with a suitable glue, which preferably does not harden into a completely stiff body and according to what is demonstrated in FIGS. 2, 3a 3b 4a or 4b depending if the circuit is assembled having the active side upwards or downwards. If the circuit is to be assembled having the active side downwards and having the back of the semiconductor chip to a cooling body it is possible prior to the gluing for a bending tool to bend the terminals according, for instance, to FIG. 5a. Such a bending tool is simple to make as each side of the cut TAB structure according to FIG. 1b or FIG. 1d, may be separately bent. For a TAB structure cut according to FIG. 1d the corner pieces are preferably removed according to what was said above, whereby no film will be bent, which considerably simplifies the method for bending and the width of bending tool itself will be independent of the width and length dimensions of the circuit and will be generally usable for all circuits.

Subsequent to that the chip having the cut TAB structure, alternatively all chips, being fixed onto the substrate the wire-bonding is performed according to a well known principle, which if desired simply allows for software control of this interconnection process.

In summary, the following advantages obtained by the method of mounting a chip having a TAB structure by the method of the present invention may be lined up:

a) only one general cutting tool is needed for many different sizes and designs of the TAB structures;

b) all present TAB structures according to standards may directly be utilized;

c) a bending of the leads to have these slightly resilient is normally not needed;

d) the wire-bonding is possible to be carried out very flexible through e.g. software control of the bonding device;

e) the points of bonding are simple to control, why the positioning of the chip having TAB structure is simplified compared to ordinary assembly of the TAB structure where it is essential that all terminal leads with high accuracy hit the substrate bonding pads;

f) it is easy to correct or change each separate wire-bonding;

g) very good signal transmission is obtained in an assembly of the semiconductor chip having the active surface downwards, so called 'face-down' mounting;

h) bonding takes place very close to the semiconductor chip, why this circuit will demand small space on the substrate;

i) all on the substrate included semiconductor chips may be glued like ordinary chips and subsequently all chips are wire-bonded in one single sequence, in other words not only TAB structures may be bonded in the same process without the use of several different tools;

j) chips having TAB structure may advantageously be used also at small production levels without rising the price by investments into particular different tools for the respective circuits; and k) the method permits without problem the introduction of future development of wire-bonding such as e.g. rectangular wires, other wire material for extended possibilities in wire layout or other materials for the bonding pads.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

We claim:

1. A method for mounting a circuit with a Tape Automated Bonding (TAB) structure onto a substrate, which circuit is delivered on a running carrier in the form of a supporting film layer or a film strip, the TAB structure terminal leads constituting an electrically conducting interconnection pattern being manufactured onto said film strip and being connected to a semiconductor chip of said TAB structure, the method comprising the steps of:

cutting each side of the TAB structure supporting film and the TAB structure's electrically conducting terminal lead pattern close to the chip side edges with a standard straight cutting tool to a predetermined length, so that terminal leads of a predetermined length are produced;

positioning the circuit having TAB structure on a final substrate in one of a face-up and face-down orientation, attaching one of said semiconductor chip and said TAB structure terminal leads to the final substrate with a resilient glue, and electrically interconnecting said TAB terminal leads by bonding wires between the terminal leads and corresponding electrically conducting pads on said substrate.

2. The method according to claim 1, further comprising the step of laminating an insulated screening layer between said TAB structure terminal leads for a screened wire-bonded interconnection with said electrically conducting terminal lead pattern, said screen being connected by a separate bonding wire to a suitable potential onto the substrate.

3. The method according to claim 2, wherein for a face-up mounting of said chip having a TAB structure, said TAB structure's electrically conducting terminal lead pattern is cut long enough and with or without maintaining the ring of supporting material to subsequently be bent in a direction towards said substrate, after which it will be interconnected by bonding wires to corresponding bonding pads on said substrate, said bonding wires then being made as short as possible.

4. The method according to claim 1, wherein for a face-down mounting of said chip having a TAB structure, said TAB structure's electrically conducting terminal lead pattern is cut into a length sufficient to extend from said chip for being connected by bonding wires to corresponding bonding pads on said substrate, said bonding wires being made as short as possible.

5. The method according to claim 4, further comprising the step of bending a portion of said electrically conducting terminal lead pattern extending out after the cutting of said TAB structure prior to attachment to said substrate to accomplish a small elasticity or mobility for attaching said semiconductor chip to a suitable cooler.

6. The method according to claim 1, wherein for a face-up mounting of said chip having a TAB structure, said TAB structure's electrically conducting terminal lead pattern is cut close to said chip, said bonding wires to corresponding bonding bumps on said chip then being made on the upper side of the remaining pattern via the connections on the chip.

7. The method according to claim 1, wherein for a face-up mounting of said chip having a TAB structure, said TAB structure's electrically conducting terminal lead pattern is cut long enough and with or without maintaining the ring of supporting material to subsequently be bent in a direction towards said substrate, after which it will be interconnected by bonding wires to corresponding bonding pads on said substrate, said bonding wires then being made as short as possible.

8. The method according to claim 1, further comprising that two adjacent sides of said TAB structure electrically conducting terminal lead pattern is cut simultaneously by a cutting tool having a 90° angle cutting edge.

* * * * *